US005298352A

United States Patent [19]

Thoms

[11] Patent Number: 5,298,352

[45] Date of Patent: Mar. 29, 1994

[54] EMULSION PRINTING PLATES AND EVACUATION CHANNELS

[75] Inventor: Roland H. Thoms, Cortland, N.Y.

[73] Assignee: BMC Industries, Inc., Minneapolis, Minn.

[21] Appl. No.: 806,919

[22] Filed: Dec. 13, 1991

[51] Int. Cl.[5] ..... G03F 5/00

[52] U.S. Cl. ..... 430/5; 430/323; 430/325

[58] Field of Search ..... 430/23, 5, 24, 222, 430/323, 325, 950, 961

[56] References Cited

U.S. PATENT DOCUMENTS 3,615,468 10/1971 Tiala ..... 96/96.3
4,248,948 2/1981 Matsuda ..... 430/5
5,149,608 9/1992 Deibler et al. ..... 430/5

FOREIGN PATENT DOCUMENTS 385480 1/1990 European Pat. Off. .
402616 5/1990 European Pat. Off. .

*Primary Examiner*—Marion E. McCamish
*Assistant Examiner*—S. Rosasco
*Attorney, Agent, or Firm*—Jacobson & Johnson

[57] ABSTRACT

A photo printing plate having an upper air evacuation channel and a lower air evacuation channel with the lower air evacuation channel formed in a emulsion layer and the upper air evacuation channels formed by spacers located partially on top of the opaque pattern that projects outward from the emulsion layer and partially on top of the nonopaque emulsion layer adjacent to the opaque pattern to provide an air evacuation channel formed by the evacuation channels in the emulsion surface and the spacers so that the air can be rapidly evacuated between the photo printing plate and a layer of etchant resist while maintaining the layer of etchant resist less than 10 microns from the top surface of the photo printing plate.

9 Claims, 1 Drawing Sheet

EMULSION PRINTING PLATES AND EVACUATION CHANNELS

FIELD OF THE INVENTION

This invention relates generally to photo printing plates and etchant resist covered metal webs and, more specifically, to air evacuation passages on the photo printing plates used to project etchant patterns in the etchant resist located on the surface of a metal web or the like and also to a method of accurately and precisely forming images in the etchant resist covering the metal web while providing rapid evacuation of air between a photo printing plate and an etchant resist covered metal web.

BACKGROUND OF THE INVENTION

In a colored cathode ray picture tube a shadow mask or aperture mask is located between the electron guns at the rear of the tube and the phosphor coated face plate at the front of the tube. Electron beams pass through tiny opening or apertures in the shadow mask and impinge upon suitable color producing phosphor dots, a triad one dot for each of the three primary colors. During operation of the picture tube the shadow mask openings are used as a guide for the electron beams.

In order to manufacture the shadow masks for use in the cathode ray tubes that are used in color monitors it is necessary to proceed through a number of steps to etch a metal web into a shadow mask having the small precision openings of proper dimensions and proper location. In a typical shadow mask manufacturing process one has to first make a photographic printing plate with a glass base. The photographic printing plate is referred to as a photo printing plate and it contains a master pattern for use in projecting an etchant resist pattern in a layer of etchant resist such as fish glue resist which is located on the surface of a metal web.

One of the methods used to create a photo printing plate involves applying a layer of a light sensitive emulsion to a sheet of smooth, flat glass. Next, the emulsion layer is exposed to a light source to form a first pattern in the emulsion. The emulsion is then developed to produce a master pattern on the glass base. The photo printing plate is used for optically defining an etchant resist pattern in a layer of etchant resist such as fish glue resist which is located on a metal web or the like. Since precision etching of small openings usually requires selective etching from both sides of the metal web a second photo printing plate is made for projecting a second master pattern in a second layer of fish glue resist that is located on the opposite side of the metal web. Fish glue resist is a commonly used light sensitive etchant resist which is applied as a liquid and allowed to dry forming a layer of etchant resist that has a thickness of about 3 to 10 microns.

The two photo printing plates with the master patterns are placed in register on opposite sides of the metal web and in contact with the respective layers of fish glue resist on the metal web. Next, one draws the photo printing plates into intimate contact with their respective layers of fish glue resist by pumping out the air between the photo printing plates and their respective layers of fish glue resist on the metal web. The removal of the air brings the photo printing plates into close proximity of their respective layers of fish glue resist. Next, one selectively exposed the light sensitive fish glue resist by directing light through the photo printing plates. After exposing the light sensitive fish glue resist to a suitable light source one develops the fish glue resist. During developing, the soluble portions of the fish glue resist are removed leaving a pattern of metal exposed openings in the fish glue resist. The openings in the fish glue resist permit an operator to etch the metal web in the areas not protected by the fish glue resist.

One of the problems in accurately etching openings in a metal web is the difficulty in accurately projecting the image on the photo printing plate onto the fish glue etchant resist on the metal web. In one type of photo printing plates a master pattern on a glass base is formed in an emulsion layer about 3 toi 5 microns thick. The actual opaque pattern formed in the emulsion may project outward from the emulsion surface a distance of about one micron. One of the factors affecting the accuracy of the image formed in the fish glue etchant resist on the metal web is how close the top of the opaque master pattern on the photo printing plate is to the etchant resist when the master pattern is projected onto the fish resist glue. Since light scatters as it travels between the master pattern and the fish glue resist it is extremely important that the etchant resist master pattern on the photo printing plate is located in as close proximity as possible to the layer of fish glue resist on the metal web. Ideally the master pattern on the photo printing plate would be located in direct contact with the fish glue resist on the metal web. However, the closer to direct contact between the photo printing plate and the fish glue resist the longer it takes to evacuate the air between the two and consequently the slower and more costly process for forming the aperture mask. To bring the etchant resist master pattern on the glass base to as close proximity as possible to the fish glue resist on the metal web the air between the etchant resist master pattern on the glass base and the fish glue resist on the metal web must be pumped out through channels located between the projecting master pattern on the glass photo printing plate.

One of the problems associated with accurately making the etchant resist pattern in the fish glue on the metal web is that in order to obtain rapid evacuation of the air between the printing plate and the fish glue etchant resist it is necessary to have air evacuation channels that have a minimum depth of about 8 microns. If the depth of the air evacuation passages is less than about 8 microns the time required to evacuate the air increases considerably. On the other hand if the spacing between the fish glue and the photo printing plate is made larger than about 8 microns the accuracy of the final image in the fish glue is reduced. In order to space the fish glue and the master pattern about 8 microns from each other islands of rubbery material are placed on top of the master pattern ont he photo printing plate. These islands or spacers form air evacuation passages and consequently decrease the time necessary to evacuate the air between the fish glue resist and the master pattern. However, the addition of islands on top of the emulsion causes the master pattern on the photo printing plate to be further away from the fish glue resist when the image is projected onto the fish glue resist. Consequently, the sharpness of the image formed in the fish glue resist decreases as the height of the spacers increases. The present invention provides a method and evacuation channels that are formed partially in the emulsion layer and partially by islands located on the emulsion. The results is set of composite air evacuation channels that extend contiguously from the glass surface of a photo printing plate to a fish glue resist layer located on the metal web. The present invention permits a user to obtain rapid evacuation while still maintaining the accuracy and preciseness of the image in the etchant resist.

DESCRIPTION OF THE PRIOR ART

The Mears U.S. Pat. Nos. 2,710,591 and 2,710,814 shows a machine for producing a light sensitive etchant resist coating on a metal web that is to be etched into a shadow mask.

The Mears U.S. Pat. No. 2,720,146 shows a photo printing apparatus that is used to draw the photo printing plates into surface contact with the etchant resist on the metal web.

The Mears U.S. Pat. No. 2,751,829 shows a machine for developing and heat treating the etchant resist coatings on a metal web.

the Mears U.S. Pat. No. 2,791,514 shows an apparatus and method for coating a metal web with a liquid coating of an etchant resist and than drying the coating to form a continuous etchant resist coating over a metal web.

The Mears U.S. Pat. No. 2,762,149 shows a method for etching a metal web selectively coated with an etchant resist.

The Mears U.S. Pat. No. 2,786,443 shows an apparatus for applying a coating of etchant resist to a vertically held metal web.

The Mears U.S. Pat. No. 2,814,975 shows a photo printing apparatus for holding photo printing plates in register on opposite sides of a metal web with chambers along the periphery of the photon printing plate to permit one to evacuate the air between the emulsion layer on the printing plate and the etchant resist.

The Brown U.S. Pat. No. 3,199,30 shows a photo printing apparatus for holding printing plates in register with the photo printing frame using ball socket joints.

The Wickland U.S. Pat. No. 2,757,087 shows a method of making the master etchant resist pattern that is to be formed on a photo printing plates by using a ruled glass plate having a set of opaque, parallel lines that are used to make three identical prints on a photographic film. The three prints are then overlaid one another and rotated to product the desired pattern of openings. After producing the desired primary master pattern of openings the primary master pattern is reproduced in a light sensitive emulsion on a photo printing plate which is subsequently used to lay out the pattern of openings in the etchant resist on a metal web.

The prior art Mears and Brown patents taught the use of evacuating the region between the photo printing plate and the etchant resist to tightly sandwich the emulsion master pattern against the etchant resist. The more intimate and thorough contact between the photo printing plate and the etchant resist generally the sharper the image one can obtain. One of the problems with photo printing plates that use emulsion coatings is that the emulsion coating being relative soft sometimes form gasket like seals against the etchant resist. In order to decrease the time necessary to evacuate the air from between the emulsion master pattern and the etchant resist various types of air evacuation channels have been formed in the emulsion coating.

For example, the Detrick U.S. Pat. No. 3,897,251 teachesd one to expose and remove the emulsion between the opaque portions of the master pattern thereby leaving islands of emulsion master patterns with channels therebetween to permit the air to be rapidly evacuated between the photo printing plate and the etchant resist.

Still another method of decreasing the evacuation time for emulsion coated printing plates is shown in the Tiala U.S. Pat. No. 3,615,468 which teaches one to incorporate hard abrasive particles having dimensions up to 100 microns thick into the emulsion coating. The hard abrasive particles which are located in the soft emulsion extend through the emulsion to act as spacers between the photo printing plate and the etchant resist layer on the metal web thereby decreasing the evacuation time. The hard abrasive particles which are thicker than the emulsion layer extend through the emulsion layer to contact the etchant resist on the metal web and prevent the etchant resist from coming into surface contact with the emulsion layer. Tiala points out that the island particles can be dispersed throughout emulsion since the light apparently diffuses around the small particles to permit exposure of the etchant resists on the metal web.

Another method of increasing the spacing between the thin hard master pattern and the etcahtn resist is described in Moscony et al. U.S. Pat. Nos. 4,588,676; 4,656,107 & 4,664,676. In general the Moscony et al. prior art patents vapor deposit a hard thin iron oxide coating on a glass master plate to form a photo printing plate. The iron oxide coatings may be up to twenty times thinner than the emulsion coatings. The thinner coating also make it difficult to quickly evacuate the region between the printing plate and the etchant resist layer on the metal web. In order to minimize the delay in evacuating the air from between the photo printing plate and the coating of etchant resist on the metal webs the Moscony et al. patents like Tiala have built islands or spacers to provide larger evacuation paths. The Moscony et al. patents place rubbery islands on top of the thin, hard master pattern and the glass support plate to provide deeper evacuating channels between the master pattern and the etchant resist.

More specifically the Moscony et al. U.S. Pat. Nos. 4,588,676; 4656,107 & 4,664,676 teach the placement of rubbery islands over the thin hard master patterns to provide deeper channels for the air to be evacuated from between the master pattern and the etchant resist. Tiala uses islands of hard abrasive particles that extend down to the glass support plate to provide the spacing support thereby increasing the depth of the channels which decreases the evacuation time necessary to remove air form between he emulsion and the etchant resist alyer on the metal web. Moscony et al. points out that the problems in providing evacuation channels in the emulsion coated printing plates are grossly different than the problems in providing evacuation channels for master patterns of hard, non-tapered, grossly-thinner, fully-opaque portions. In its prosecution history Moscony et al points out "that the fact that the coating is rubbery has little effect on a structure with an emulsion master pattern (which is compressible), but this feature produces substantial benefits in combination with the grossly thinner master pattern . . . " In contrast to the teachings of Moscony et al and Tiala that use a hard glass surface for their spacer particles the present invention utilized spacers not on the glass support surface but on top of both the opaque and the nonopaque compressible emulsion pattern. The spacers form larger evacuation channels between the emulsion master pattern the etchant resist layer on the metal web. In addition by positioning the spacers on regions other than the strip lines one can provide for the rapid evacuation of air from between the emulsion layer and the etchant resist that are located on the interior regions of the photo printing pattern.

Another prior art patent is the Wetzel et al. U.S. Pat. No. 4,669,871 teaches one to substitute the prior art randomly cut air evacuation grooves in the peripheral area of the hard thin coatings master for more precisely defined channels of rubbery material that are located directly on the surface of the glass support plate. The air evacuation channels formed in the peripheral area are larger than the channels located on the central region of glass to thereby insure that the air can be rapidly evacuated from between the hard master pattern and the etchant resist.

BRIEF DESCRIPTION OF THE DRAWINGS

The sole FIGURE (1) shows an enlarged view of a photo printing plate with an emulsion coating and spacers sandwiched against a metal web. To illustrate the invention the magnification scales on the vertical and horizontal axis are of different magnification.

SUMMARY OF THE INVENTION

Figure 1:
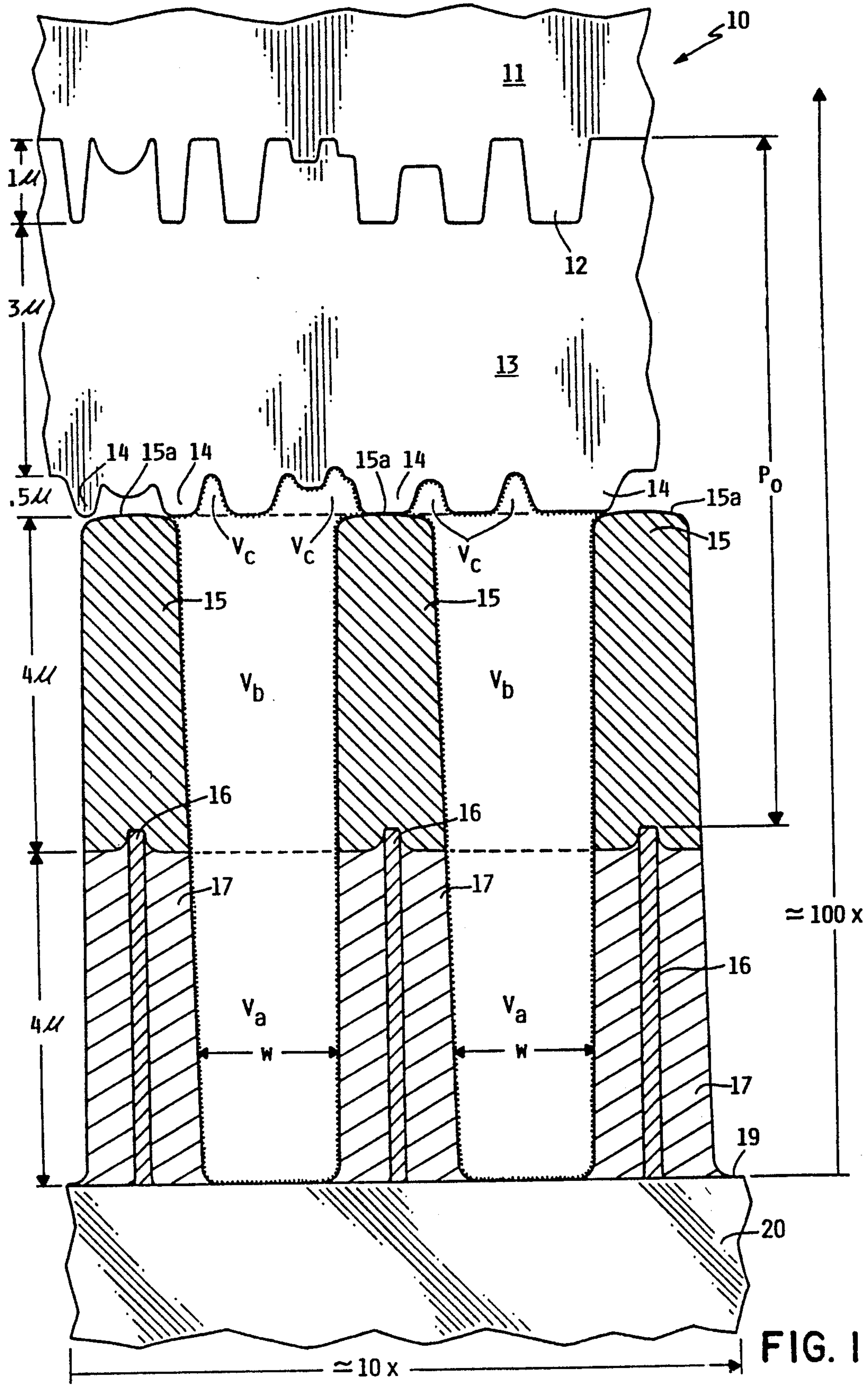

Briefly, the present invention comprises a photo printing plate having upper air evacuation channels and lower air evacuation channels with the lower air evacuation channels formed in a compressible emulsion layer and the upper air evacuation channels formed by spacers located partially on top of the opaque pattern that projects outward from the compressible emulsion layer and partially on top of the nonopaque compressible emulsion layer adjacent to the opaque pattern. The composite air evacuation channels formed by the evacuation channels int he compressible emulsion surface and the air evacuation channels formed by the spacers allow air to be rapidly evacuated between the photo printing plate and a layer of etchant resist on a metal surface while maintaining the top of the opaque pattern on the order of less than about 8 to 10 microns from the top surface of metal surface to etched.

DESCRIPTION OF THE PREFERRED EMBODIMENT

Referring to FIG. 1 reference numeral 10 identifies an enlarged portion of conventional photo printing plate and a fish glue etchant resist covered metal web for forming a color monitor aperture mask. The drawing is not a full scale enlargement since the vertical axis is magnified on the order of about 100 times and the horizontal axis is magnified on the order of about 10 times.

Photo printing plate 10 has a flat glass support surface 19 with a compressible emulsion layer 17 extending over portions of top surface 19. Located in and projecting outward from emulsion 17 is an opaque master pattern formed by a set of opaque regions 16 that are to be used to optically project opaque master pattern on a layer of etchant resist 13 on a metal web 11. Located on top of emulsion 17 and opaque regions 16 is a set of spacers 15 which have top surfaces 15*a* in contact with resist surface protrusions 14. To appreciate the relative size of the present invention typical dimensions of the thickness of the layers are indicated in microns on the left side of the drawing. The dimensions are included for the purpose of indicating the relative relationships that occur between a fish glue etchant resist 13 and the photo printing plate 20. It should be understood that during any run there will be variation in the thickness of the emulsion spacers and the fish glue etchant resist. It should also be understood that other emulsions or resist could be used with the invention.

In order to illustrate the effect of irregularities in the surface of the metal web on irregularities on the surface of the fish glue etchant resist 13 the metal web surface irregularities 12 are indicated as having a maximum amplitude of 1 micron. The corresponding irregularities in the fish glue etchant resist 13 are still present but at an amplitude of about 50% of the irregularities of the metal surface. In some instances the irregularities 12 in the surface of the fish glue etchant resist 13 can be used to provide a portion of a top air evacuation channel which is identified by $V_c$. Generally, it is preferable to have the metal surface irregularities small in comparison to the overall tolerances of the openings formed in the metal web. that is, the larger the irregularities in the surface of the metal web the greater the detrimental effect on the accuracy of the image in the etchant resist that can be formed and etched in the metal web.

The distance that master pattern images mush be projected to penetrate through the fish flue echant resist is designated by $P_o$. Typically, for high grade aperture masks this dimension should be kept to a projection distance of about 8 microns or less in order to minimize the effects of light scattering as the image of the master pattern is projected on and into the etchant resist 13. In order to rapidly evacuate the air from between the photo printing plate and the fish glue etchant resist the depth of the air channels should be 8 microns or more. To achieve the projecting distance of about 8 microns or less and obtain air evacuation channels of 8 microns or more I have formed air evacuation channels that are located partially in the emulsion and partially between spacers located on top of the emulsion 17.

The drawing shows the etchant resist protrusions 14 located in intimate contact with the top surfaces of spacers 15. The top surfaces of spacers 15 are brough into intimate contact with etchant resist 13 through he type of prior art printing frames as shown in assignees prior art Brown U.S. Pat. No. 3,199,430 and Mears U.S. Pat. No. 2,814,975. To obtain intimate contact between the printing plates and the layers of etchant resist the air is evacuated between the etchant resist layer and the photo printing plate to draw printing plate 20 into intimate contact with the light sensitive etchant resist 13.

The drawing shows that in my invention the channels or paths for evacuation of air between plate 20 and etchant resist 13 are provided for by a set of evacuation channels that are located in a stacked or contiguous relationship to each other. That is the air evacuation channel of my invention includes, an upper air evacuation channel $V_b$, a lower air evacuation channel $V_a$ and if desired a smaller top air evacuation channel $V_c$ formed in the top surface irregularities of etchant resist 13. Typically, the width of the channel may be on the order of two to four times the width of the slots formed in the metal web. Thus the air evacuation channels are substantially wider than they are deep.

In the present invention the transparent plate 20 is used for projecting light energy therethrough to project opaque images of members 16 onto resist covered metal web 11. Located on top surface 19 of transparent plate 20 is a transparent layer of compressible emulsion 17. Also located on top surface 19 is a first opaque master pattern 16 which prevents light from projecting through transparent plate 20 and onto resist 13 in those regions covered by opaque master pattern 16. The drawing shows the transparent layer of compressible emulsion 17 projecting upward from top surface 19 of transparent plate 20 and defining a lower evacuation channel $V_a$ for evacuation of a portion of the air between top surface 19 and the layer of etchant resist 13. An upper evacuation chamber is formed by a plurality of spacers 15 located on first opaque master pattern 16 and emulsion 17. The spacers 15 space the first opaque master pattern 16 from the layer of the etchant resist 13 to form an upper evacuation channel $V_b$ proximate and contiguous the lower evacuation channel $V_a$. The combination of the upper evacuation channel and the lower evacuation channel coact with the layer of etchant resist 13 to define a passage for rapid evacuation of air between plate 20 and the etchant resist 13. By utilizing a composite air evacuation channel with the composite air evacuation channel formed partially in the emulsion and partially by separate spacers with the spacing of the surface of the top surface of the transparent plate and the metal web being on the order of about 8 to 10 microns or less it enables a user to precisely project an image on the layer of etchant resist 13 and to evacuate the air between the top surface of the transparent plate and the etchant resist in less than 30 seconds.

In the method of the present invention for etching aperture masks for cathode ray tubes the user forms a layer of compressible emulsion 17 on a support plate. Next one selectively develops the layer of compressible emulsion 17 to produce opaque images 16 that project outward from the layer of compressible emulsion 17. One can then selectively remove the layer of compressible emulsion to form a lower air evacuation channel $V_a$ in the layer of compressible emulsion 17. By placing spacers 15 on top of the compressible emulsion opaque pattern 16 and on top of a portion of the compressible emulsion 17 that does not have the opaque pattern one defines an upper air evacuation channel $V_b$. After forming the composite channel one places the spacers against etchant resist 13 located over a material such as a metal web 11. One can then quickly evacuate the air from between the glass base plate 20 and the etchant resist 13 by removing the air through the contiguous upper air evacuation channel and the lower air evacuation channel. After removing the air one develops etchant resist 13 so that the material not covered by the etchant resist can be etched. In the final step one etches the material with an etchant such as ferric chloride to produce an aperture mask.

The forming of channels in th emulsion is described in the Detrick U.S. Pat. No. 3,897,251 and is incorporated herein by reference. Similarly, the formation of islands on top of a pattern is described in the Moscony et al. U.S. Pat. Nos. 4,588,676, 4,656,107 and 4,664,676 and is also incorporated herein by reference.

Thus the present invention provides for the removable of air from between the emulsion layer and the etchant resist by forming a composite channels that is made of up an air evacuation channel located in the emulsion and an air evacuation channel located between spacers on top of the emulsion layer.

I claim:

1. An Emulsion coated printing plate for laying out a shadow mask pattern in etchant resist on a metal web comprising:

a metal web having a surface to be etched;

a layer of etchant resist located on said surface to be etched, said layer of etchant resist having a top surface;

a transparent plate for projecting light energy therethrough to project an image carried by said transparent plate onto the layer of etchant resist located on said metal web, said transparent plate having a top surface;

a transparent layer of emulsion located on said top surface of said transparent plate, said layer of emulsion having a first surface;

a first opaque master pattern carried by said transparent plate so as to prevent light from projecting into said layer of etchant resist through said transparent plate and said first opaque master pattern, said first opaque master pattern having a top surface, said transparent layer of emulsion having a plurality of regions projecting upward from said top surface of said transparent plate, said plurality of regions in said transparent layer of emulsion defining therebetween a first partial evacuation channel for partial evacuation of air between said top surface of said transparent plate and said top surface of said layer of etchant resist;

a plurality of transparent spacers located on said top surface of aid first opaque master pattern to space said first opaque master pattern from the top surface of aid layer of etchant resist to form a second partial evacuation channel between said plurality of pacers and proximate said first partial evacuation channel, said second partial evacuation channel, said first partial evacuation channel and said top surface of said layer of etchant resist coating to define a passage for rapid evacuation of air from between said transparent plate and said top surface of said layer of etchant resist, said top surface of said first opaque master pattern carried by said top surface of said transparent plate and spaced a distance ($P_o$) from said surface of said metal web with ($P_o$) being on the order of about 10 microns or less to thereby enable a user to precisely project an image into said layer of etchant resist located on said metal web and to evacuate the air from between said top surface of said transparent plate and said top surface of said layer of etchant resist in less than 60 seconds.

2. The emulsion coated printing plate of claim 1 wherein said metal web having a surface to be etched has surface irregularities of 1 micron or less.

3. The emulsion coated printing plate of claim 2 wherein said opaque master pattern comprises projections extending about one micron above said first surface of said layer of emulsion.

4. The emulsion coated printing plate of claim 3 wherein said evacuation channels are spaced substantially uniformly over said transparent plate.

5. The emulsion coated printing plate of claim 1 wherein a top portion of resist air evacuation channel ($V_c$) is formed by irregularities in said top surface of said layer of etchant resist on said metal web.

6. An emulsion coated printing plate for printing an etchant resist pattern on a resist coated material by evacuating the air from between the printing plate and the resist coated material to bring the printing plate and the resist coated material into close proximity to decrease light scattering so as to produce a sharp image in the resist coated material comprising:

a transparent plate having a top surface;

a layer of non opaque emulsion having a first surface extending over said top surface of said transparent plate, asidn on opaque emulsion having a plurality of partial air evacuation channels formed therein;

an opaque master pattern carried by said nonopaque emulsion to provide opaque regions that extend upward from said first surface of said nonopaque emulsions; and a plurality of spacers located on top of said first surface of said non opaque emulsion and on top of said opaque regions to form a plurality of further partial air evacuation channels therebetween so that when said transparent plate having aid non opaque emulsion and said spacers is placed against a second surface said plurality of partial air evacuation channels in said non opaque emulsion coact with said further plurality of partial air evacuation channels located between said plurality of spacers to form an air evacuation passage extending from the top surface of the transparent plate to said second surface so one can quickly remove air in said plurality of partial evacuation channels plurality and said further partial air evacuation channels through the air evacuation passage formed by the coating of said partial plurality of evacuation channels in said non opaque emulsion and said further plurality of partial air evacuation channels located between said plurality of spacers.

7. The emulsion located printing plate of claim 6 wherein said plurality of spacers extending approximately 3 from said top surface of said non opaque region.

8. The emulsion located printing plate of claim 6 wherein said layer of nonopaque emulsion is about 3 microns thick.

9. The emulsion coated printing plate of claim 6 wherein said spacers project a minimum of 2 microns above said first surface of said layer of nonopaque emulsion.

* * * * *